310-369 SR
1/16/79 OR 4,135,109

United States Patent [19]

Gingerich et al.

[11] 4,135,109

[45] Jan. 16, 1979

[54] HIGH POWERED PIEZOELECTRIC CYLINDRICAL TRANSDUCER WITH THREADS CUT INTO THE WALL

[75] Inventors: Larry T. Gingerich, Annapolis; John H. Thompson, Severna Park, both of Md.; Robert H. Whittaker, New Alexandria, Pa.

[73] Assignee: Westinghouse Electric Corp., Pittsburgh, Pa.

[21] Appl. No.: 831,720

[22] Filed: Sep. 9, 1977

[51] Int. Cl.$^2$ .......... H01L 41/04

[52] U.S. Cl. .......... 310/369

[58] Field of Search .......... 310/367, 369

[56] References Cited

U.S. PATENT DOCUMENTS

| | | | |
|---|---|---|---|
| 2,543,500 | 2/1951 | Kettering et al. | 310/367 |
| 3,168,623 | 2/1965 | Petermann | 310/369 X |
| 3,238,476 | 3/1966 | Borner et al. | 310/369 X |
| 3,284,762 | 11/1966 | Kompanek | 310/369 X |
| 3,718,898 | 2/1973 | Cook et al. | 310/367 X |
| 3,939,467 | 2/1976 | Cook et al. | 310/367 X |

FOREIGN PATENT DOCUMENTS

| | | | |
|---|---|---|---|
| 4420436 | 5/1966 | Japan | 310/369 |

*Primary Examiner*—Mark O. Budd
*Attorney, Agent, or Firm*—D. Schron

[57] ABSTRACT

A cylindrical transducer for providing an omnidirectional beam pattern in one plane and a line radiation pattern in planes normal to the omnidirectional pattern. The cylindrical transducer active element is a radially poled piezoceramic having a surface into which a square thread is spirally cut so that only a pair of electrical leads are needed to excite the whole assembly. In one embodiment the thread is cut entirely through the thickness of the cylinder and in another embodiment it is cut partially through.

5 Claims, 14 Drawing Figures

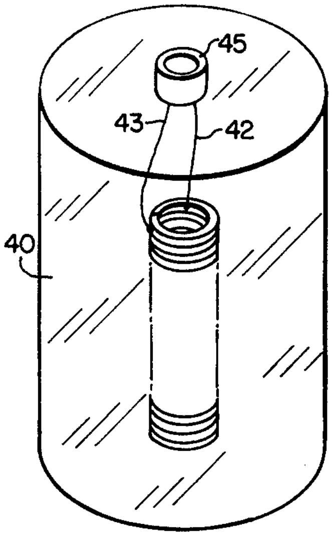
FIG.7.
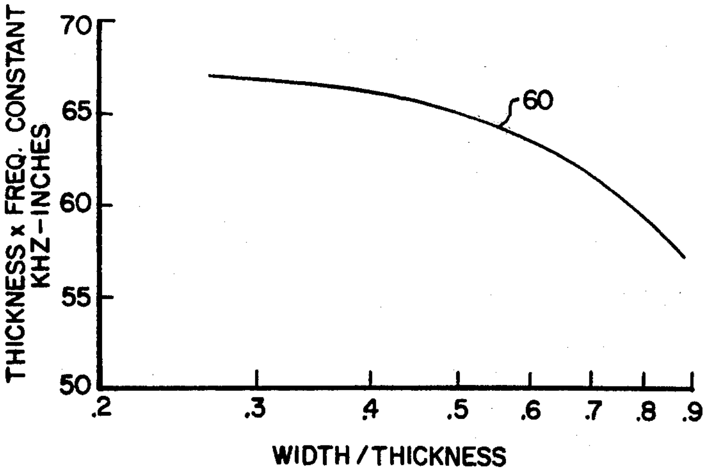
FIG.10.
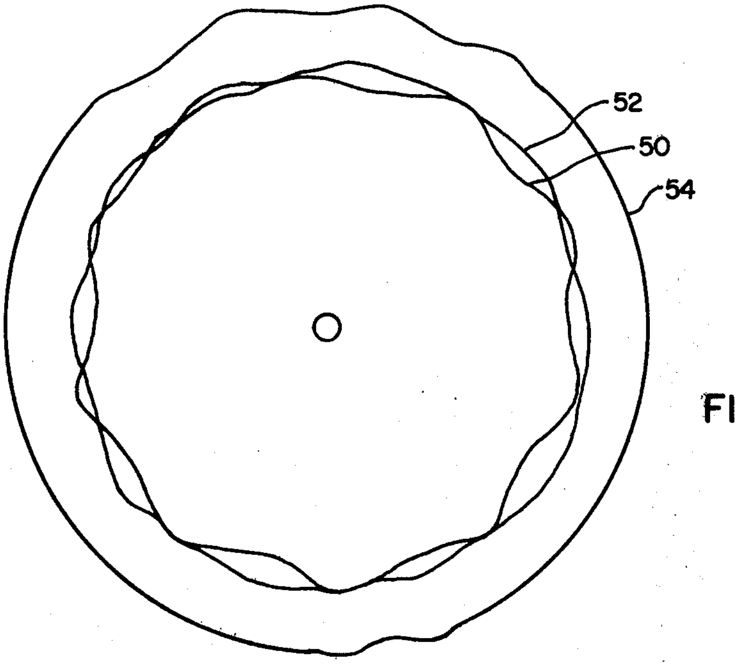
FIG. 8.
FIG. 9A.
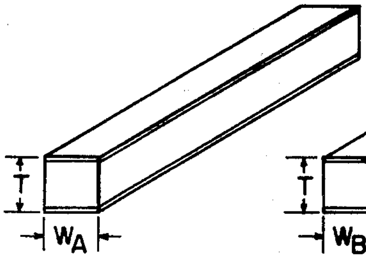
FIG. 9B.
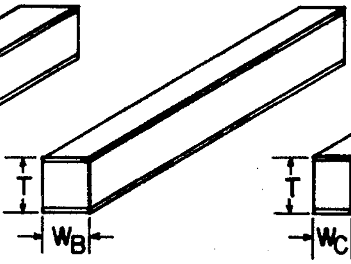
FIG. 9C.
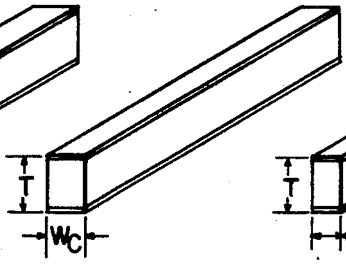
FIG. 9D.
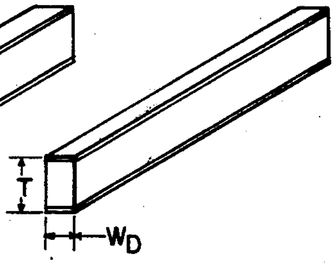

HIGH POWERED PIEZOELECTRIC CYLINDRICAL TRANSDUCER WITH THREADS CUT INTO THE WALL

BACKGROUND OF THE INVENTION

1. Field of the Invention

The invention in general relates to transducers and particularly to a transducer for providing an omnidirectional beam pattern in one plane.

2. Description of the Prior Art

A variety of transducer arrangements exist for providing an omnidirectional beam pattern in one plane and a line radiation pattern in planes normal to the omnidirection pattern. When employing large cylindrical piezoceramic tubes or cylinders that have been poled radially and operated in the thickness mode, omnidirectional patterns have been produced which are highly unsatisfactory. This may be due to the fact that when operated in a thickness plate mode or cylinder thickness mode higher overtones of various low frequency modes along with various cylindrical modes can be and are excited.

In order to eliminate unwanted modes in flat plate or wedge-shaped piezocermics resort is made to slicing and/or dicing the piezoceramic which has the effect of altering the complex mode structure and essentially completely eliminating the undesirable effects of the extraneous vibrational modes. When a piezoceramic cylinder is diced it alters the surface thereof so as to present a multitude of isolated elements or posts. In the thickness mode of operation electrical contact must be made to the inner and outer surface of the cylinder which means that adequate electrical contact must be made to all of the upstanding posts which can, for various designs, require several thousand electrode connections. Attempts to wrap a conducting foil or screen around the outside of the diced cylinder have proved unsatisfactory.

SUMMARY OF THE INVENTION

The present invention provides a high powered cylindrical transducer which operates in the thickness mode and which effectively eliminates all undesired modes so as to provide more efficient operation with a more ideal omnidirectional pattern, without the requirement for making connection to hundreds if not thousands of individual posts.

The transducer of the present invention is a radially poled piezoceramic cylinder which has a spiral groove cut into it along the length thereof. In effect, threads are cut into the surface of the cylinder at a predetermined pitch and in one embodiment the threads are cut partially, for example 80% of the way through, and in another embodiment a thin-walled cyldrical tube is put over a backing member and the threads are cut 100% of the way through from the front surface to the back surface of the cylinder wall.

BRIEF DESCRIPTION OF THE DRAWINGS

FIG. 7 is a view of a typical transducer installation ready for deployment;

FIG. 8 illustrates some beam patterns of a transducer fabricated in accordace with the present invention;

FIGS. 9A through 9D illustrate various sample size relationships for obtaining certain data points for the curve of FIG. 10; and FIG. 10 is a curve to assist in the design of the transducer of the present invention.

DESCRIPTION OF THE PREFERRED EMBODIMENT

Figure 1A:
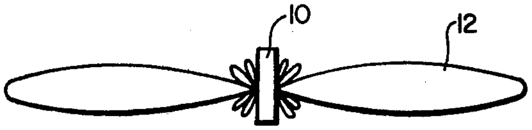
FIG. 1A illustrates an idealized vertical beam pattern and FIG. 1B an idealized horizontal omnidirectional beam pattern for a line transducer.
Figure 1B:
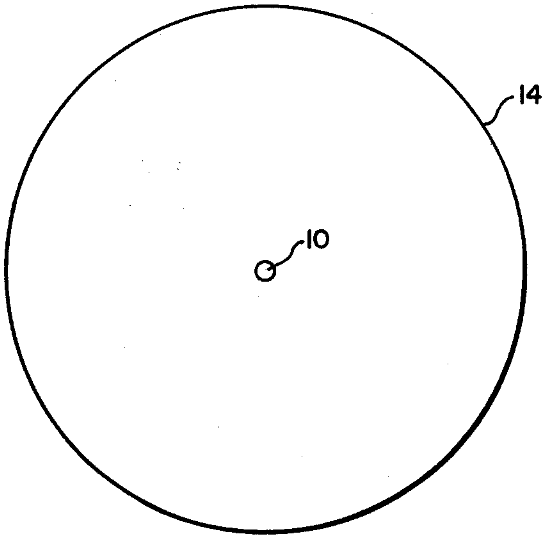

In FIG. 1A a thin-walled cylindrical transducer 10 is illustrated in a vertical position in conjunction with its vertical beam pattern 12, the beamwidth of which is a function of the length of the transducer 10. As illustrated in FIG. 1B, the horizontal beam pattern 14 ideally is omnidirectional.

The thin-walled cylindrical transducer is operated in the thickness mode and with various transducer parameters, a plurality of other, objectionable modes may be generated. The net result is the generation of a highly distorted omnidirectional beam pattern, such as illustrated by beam pattern 16 in FIG. 2, the beam pattern being the result of the various mode interactions.

Figure 3:
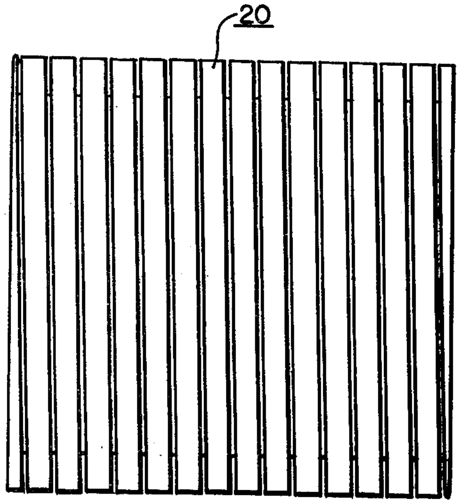
FIG. 3 illustrates one embodiment of the present invention.

In order to reduce, if not completely eliminate the undesirable effects of the extraneous modes, the cylindrical transducer active element of the present invention has threads cut into one surface, for example the outside surface thereof such as illustrated in FIG. 3. The transducer active element is a piezoceramic thin-walled cylinder 20, lead zirconate-titanate being one example. Although a single spiral groove is illustrated, the threads may be cut with a double spiral or triple spiral, for example forming double thread and triple thread structures.

Figure 4:
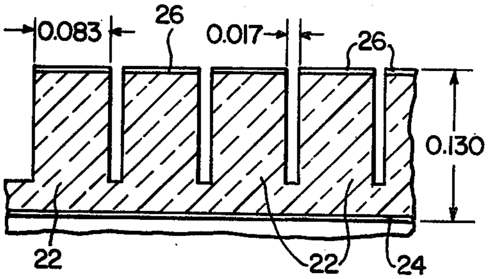
FIG. 4 is a sectional view of a portion of the transducer illustrated in FIG. 3.

A cross-sectional view of a portion of the cylinder is illustrated in FIG. 4 which shows several of the threads 22 cut into the outside cylindrical wall.

The inside and outside walls of the cylinder are covered by electrodes such that after machining of the threads the inside wall maintains its electrode 24 while each thread 22 includes an appropriate electrode 26. In this manner only two electrode lead connections need be made to the active element, one to the inside electrode 24 and the other to any one of the electroded threads.

By way of example and not by limitation, the element of FIG. 3 was fabricated and had the following characteristics:

Outside diameter — 1.5"
Length — 1.5"
Wall thickness — 0.130"
Depth of cut — 80%
Distance between threads — 0.017"
Width of thread — 0.083"
Number of threads to the inch — 10
Width of thread to wall thickness ratio — 0.638

The threads may be cut by any one of several well-known manufacturing techniques for cutting threads, however it has been found that a square thread may be cut with relative ease by means of a wet diamond wheel saw with the distance between the threads therefor being equal to the kerf of the diamond wheel.

Figure 6:
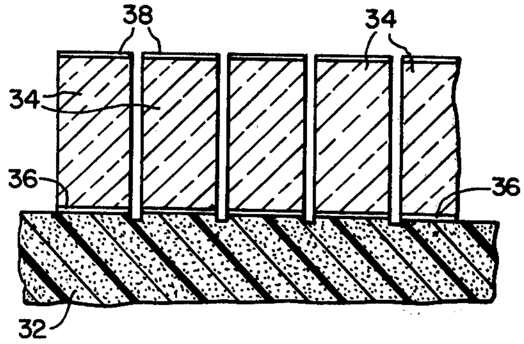
FIG. 6 is a sectional view of a portion of the transducer shown in FIG. 5.
Figure 5:
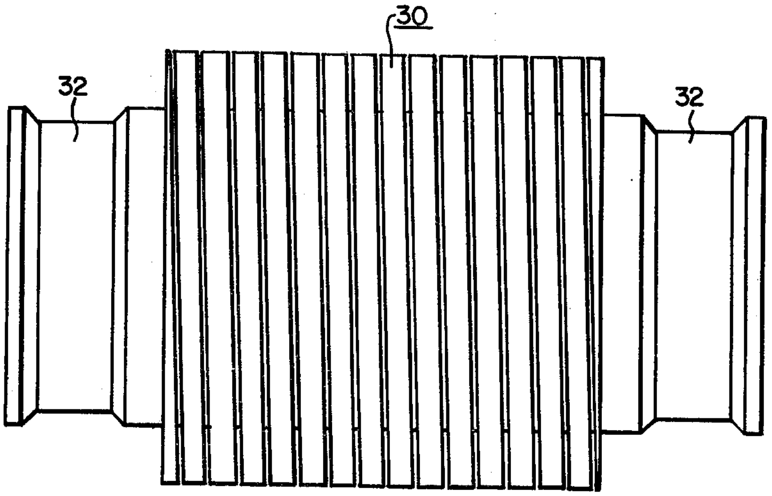
FIG. 5 is another embodiment of the present invention.

In FIG. 5 a thin-walled cylindrical piezoceramic active element 30 is similar to the active element of FIG. 3 except that the threads are cut all the way through from the outside to the inside surface of the cylinder. For this purpose a suitable backing member 32 such as a syntactic foam plug is provided to act as a supporting means for the cut cylinder. A section of the cylinder illustrated in FIG. 6 shows the individual threads 34 having suitable electrodes 36 and 38. Since the structure is a helix, electrical connections, like the embodiment of FIG. 3 need only to be made to the inside and outside electrode of one thread.

An elongated cylinder suitably threaded as in FIGS. 3 or 5 may be potted, as illustrated in FIG. 7, in a suitable potting compound 40 such as polyurethane and electrode leads 42 and 43 are connected between the inside and outside surfaces of the cylinder and a waterproof connector 45.

Figure 2:
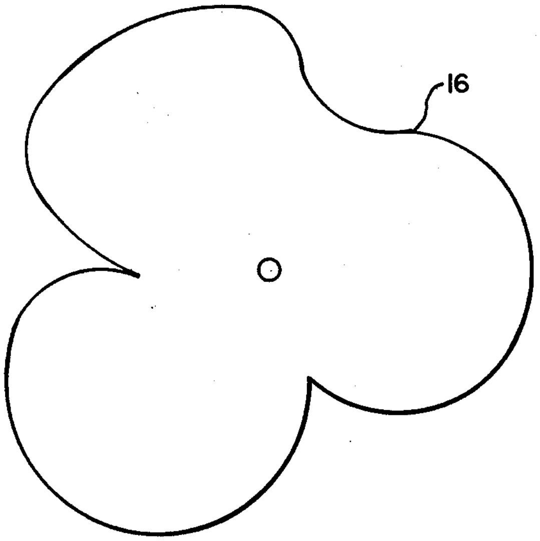
FIG. 2 illustrates an actual omnidirectional beam pattern due to mode interaction.

The transducer element of FIG. 3, with the parameters given, was tested at various frequencies and curve 50 of FIG. 8 shows the omnidirectional response at a frequency of 100 kHz, curve 52 at 125 kHz, and curve 54 at 450 kHz. It is believed that the low frequency ripples on curves 50 and 52 are probably overtones of the low frequency modes of the uncut portion of the cylinder. Even with the low frequency ripples, however, these patterns are far superior to a typical pattern 16 as illustrated in FIG. 2. Further, at the higher frequencies and in the fully cut embodiment, the low frequency ripples disappear entirely.

The initial design of the transducer may be accomplished by methods similar to that taught in copending application Ser. No. 825,514, filed Aug. 17, 1977 and to the same assignee as the present invention. For example, as illustrated in FIGS. 9A through 9D, a plurality of samples of transducer material may be cut so that they have different width-to-thickness (W/T) ratios, $W_A$, $W_B$, $W_C$ and $W_D$ denoting the width, and corresponding to the width of a thread, while the thickness T is the same in each case, corresponding to the wall thickness of the cylinder. Each sample has suitable electroded top and bottom surfaces and are of a length generally between five to ten times the thickness T.

Each sample therefore has a certain width-to-thickness value forming one variable in the curve of FIG. 10. The other variable is a value equivalent to the thickness times operating frequency and this value for each sample is obtained by applying a swept frequency signal to the sample and multiplying the frequency at which the current is a maximum, times the thickness of the sample. A curve 60 therefore may be generated with sufficient data points, and it has been found that four data points are adequately sufficient. The curve is continuous and definable between the approximate limits of $0.25 < W/T < 0.9$. Curve 60 therefore represents the situation for a 100% depth cut such as the embodiment of FIG. 5. An 80% depth cut such as the embodiment of FIG. 3 or other percent cut curve will closely parallel curve 60 and may be obtained by actually cutting a number (for example two to obtain two data points) of cylinders the desired percentage of the way through, with different thread width-to-thread depth ratios. Thus having a curve such as curve 60, a desired operating frequency may be chosen for a particular thickness of cylindrical wall so that the dimension of the thread width may be calculated.

We claim:

1. A transducer comprising:

(A) a radially poled tubular piezoceramic cylinder;

(B) electrode means on the inside and outside walls of said cylinder;

(C) said cylinder having threads cut into one of said walls along the length thereof, at a predetermined pitch; and (D) the ratio of thread width to cylinder wall thickness being less than unity.

2. Apparatus according to claim 1 wherein (A) said outside wall is cut partially through to the inside wall.

3. Apparatus according to claim 2 wherein (A) the depth of cut is approximately 80% of the cylinder wall thickness.

4. Apparatus according to claim 1 which includes (A) backing means contacting the inside wall of said cylinder; and wherein (B) said threads are cut 100% of the way through said cylinder wall to said backing means.

5. Apparatus according to claim 1 wherein (A) said threads are square threads.

* * * * *